United States Patent
Sunaga et al.

(10) Patent No.: US 7,317,304 B2
(45) Date of Patent: Jan. 8, 2008

(54) INDUCTIVE LOAD DRIVING DEVICE

(75) Inventors: Hideki Sunaga, Tokyo (JP); Kaoru Tanaka, Tokyo (JP); Masaharu Tomiyama, Tokyo (JP)

(73) Assignee: Calsonic Kansei Corporation, Tokyo (JP)

( * ) Notice: Subject to any disclaimer, the term of this patent is extended or adjusted under 35 U.S.C. 154(b) by 0 days.

(21) Appl. No.: 11/392,954

(22) Filed: Mar. 30, 2006

(65) Prior Publication Data
US 2006/0238950 A1    Oct. 26, 2006

(30) Foreign Application Priority Data
Apr. 21, 2005    (JP) .............................. 2005-123841

(51) Int. Cl.
*G05F 3/16*    (2006.01)
*H02P 7/06*    (2006.01)

(52) U.S. Cl. ....................... 323/225; 318/811; 323/267; 388/804

(58) Field of Classification Search ................ 318/439, 318/599, 801, 808–811, 77; 323/267, 268, 323/271, 225; 363/40, 41, 97, 109, 131, 363/152, 176; 388/804, 831
See application file for complete search history.

(56) References Cited
U.S. PATENT DOCUMENTS 6,674,258 B2 *    1/2004    Sakai et al. .................. 318/439
6,891,342 B2 *    5/2005    Nakamura et al. ............ 318/77
2004/0027105 A1    2/2004    Nakamura et al.

FOREIGN PATENT DOCUMENTS

| EP | 1 458 085 A2 | 9/2004 |
|---|---|---|
| JP | 64-054502 A | 3/1989 |
| JP | 6-189593 A | 7/1994 |
| JP | 10-002222 A | 1/1998 |
| JP | 2003-259634 A | 9/2003 |

* cited by examiner

*Primary Examiner*—Gary L Laxton
(74) *Attorney, Agent, or Firm*—Foley & Lardner LLP

(57) ABSTRACT

An inductive load driving device includes two inductive loads (20A, 20B) connected to a power source (21), two switching elements (15A, 15B), which are connected in series to the two inductive loads, respectively, their on/off are controlled by a pulse width modulation signal, respectively, and a control device (30), which outputs the pulse width modulation signal to each of the two switching elements, and the pulse width modulation signal is configured such that a rising edge of one pulse of the pulse width modulation signal to be output to one switching element starts between an end point of a rising edge and a start point of a trailing edge of one pulse of the pulse width modulation signal to be output to the other switching element, and a time from a start point of a trailing edge to an end point of the trailing edge of the one pulse of the pulse modulation signal to be output to one switching element does not overlap with a time from the start point of the trailing edge to an end point of the trailing edge of the one pulse of the pulse width modulation signal to be output to the other switching element.

4 Claims, 17 Drawing Sheets

FIG.7 Example 1 of simulation result of harmonic noise of the second embodiment

FIG.11
Example 1 of simulation result of harmonic noise of the third embodiment
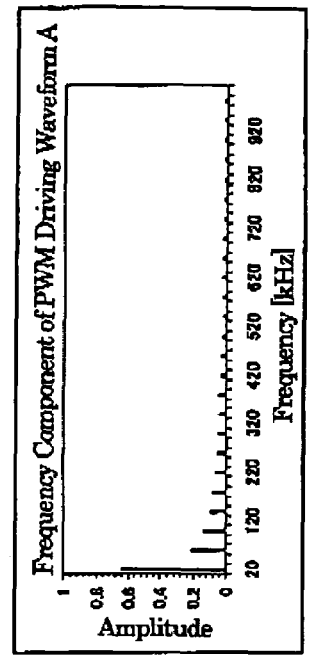
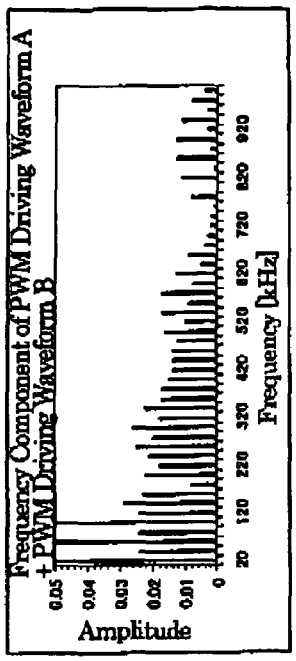
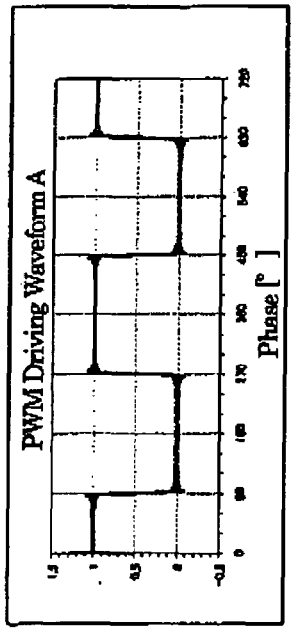
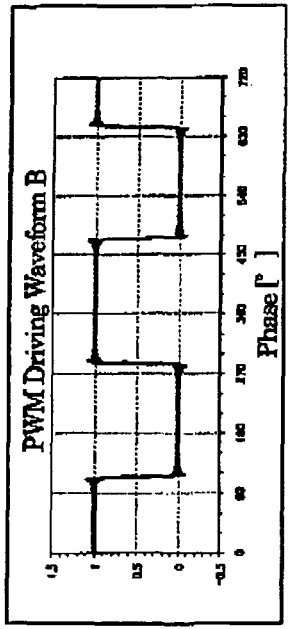
PWM Frequency [×10kHz] : 2
Duty Ratio [%]
 PWM Driving Waveform A : 50
 PWM Driving Waveform B : 52.5
Phase Difference [degree] : 20

FIG.12 Example 2 of simulation result of harmonic noise of the third embodiment

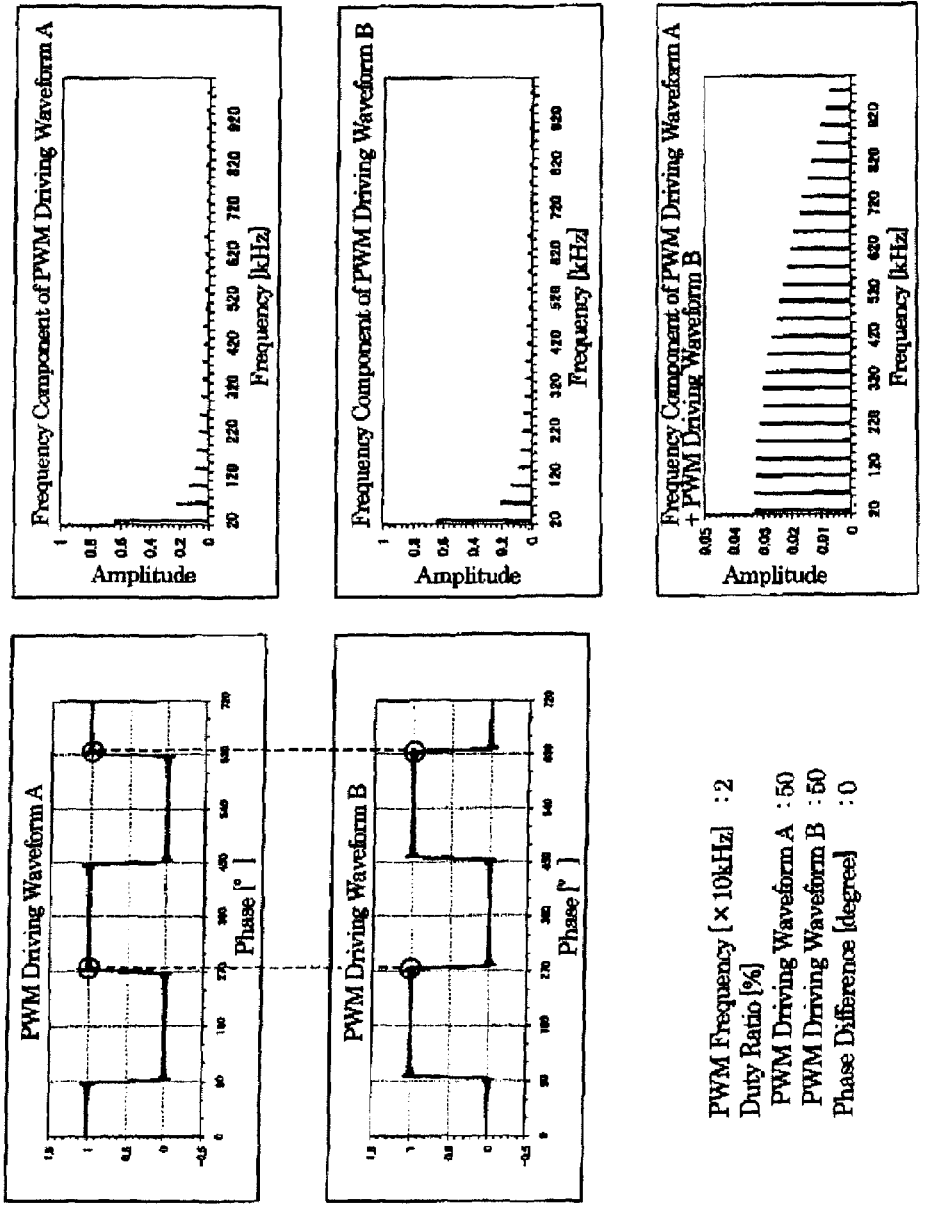

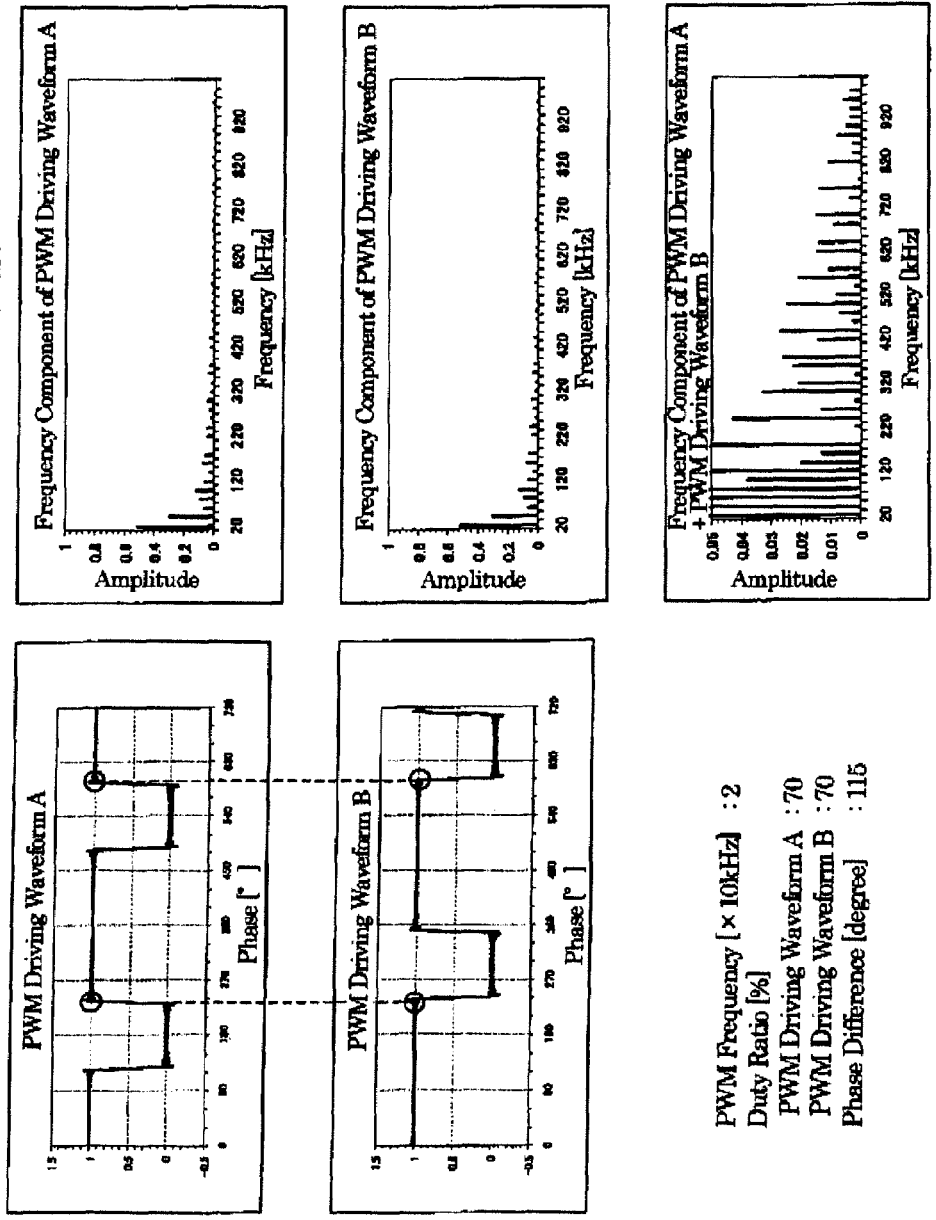

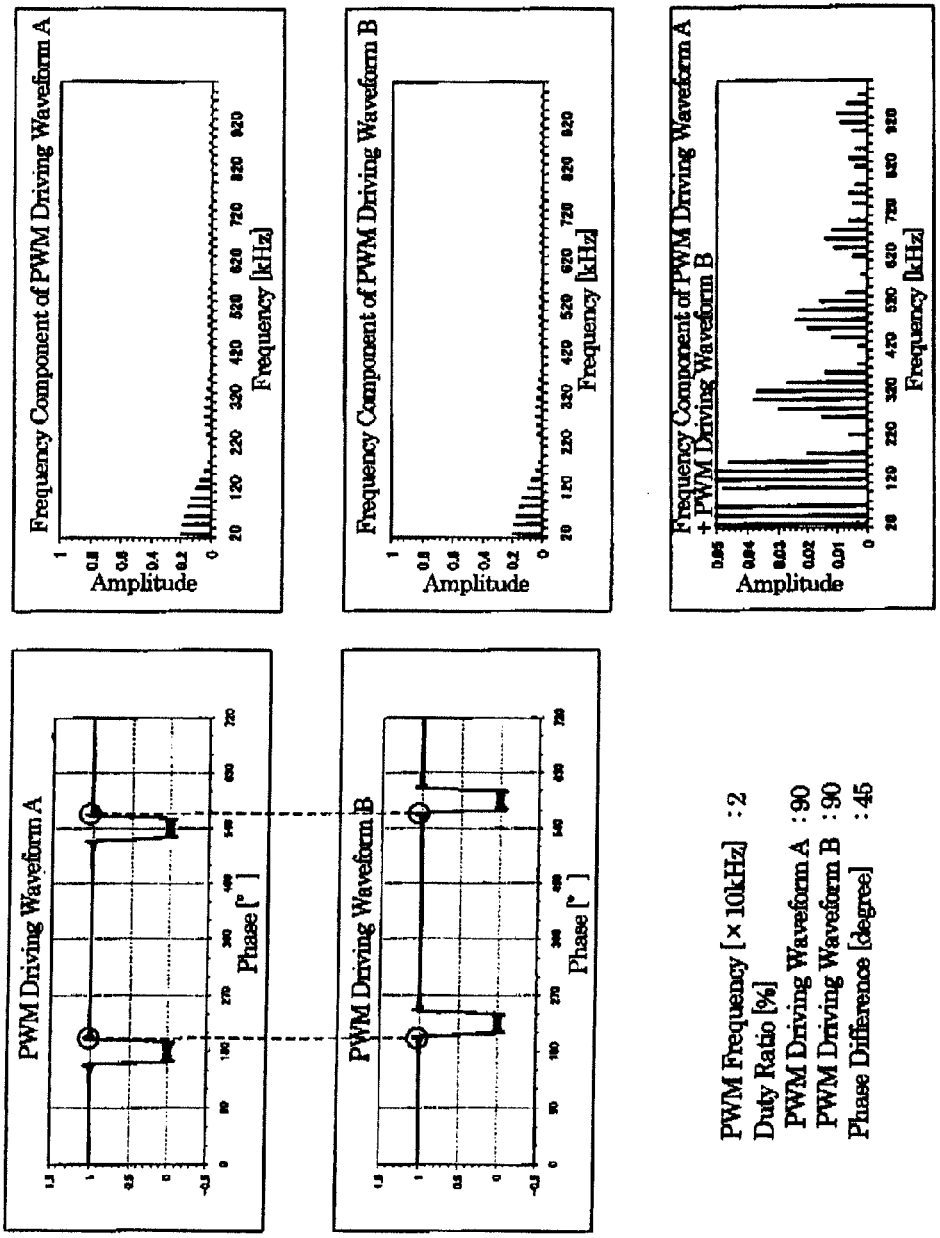

INDUCTIVE LOAD DRIVING DEVICE

BACKGROUND

1. Field of the Invention

The present invention relates to an inductive load driving device.

2. Description of Related Art

There has been proposed various methods, which lower noise generated when a plurality of inductive loads such as motors is simultaneously driven by pulse width modulation (PWM) signals. For example, in cases where two motors are driven by two MOSFET, there has been proposed a method, which lowers switching noise by avoiding the simultaneous switching of the two MOSFET (reference to JP-A-H10-2222). With this method, the PWM driving signal input to one MOSFET is out of phase with the PWM driving signal input to the other MOSFET, and the phases are set such that the end timing of rising edge of one pulse conforms to the start timing of trailing edge of the other pulse, in order to avoid the simultaneous switching of the two MOSFET.

With such an inductive load driving device, the switching noise of MOSFET is lowered, but harmonic noise generated in the changing points of the two PWM driving signals can not be sufficiently lowered. More particularly, when the two PWM driving signals are adopted to be a PWM driving signal A and a PWM driving signal B, and looking at the temporary changes in one cycle of the both signals, the seven changing points exist, such as the start point of rising edge of the PWM driving signal A→the end point of rising edge of the PWM driving signal A (=the start point of trailing edge of the PWM driving signal B)→the end point of trailing edge of the PWM driving signal B→the start point of trailing edge of the PWM driving signal A→the end point of trailing edge of the PWM signal A→the start point of rising edge of the PWM driving signal B→the end point of rising edge of the PWM driving signal A, and harmonic noise is generated in each of the changing points as shown in FIG. 14. Therefore, the noise that the frequency component is further increased is generated in its entirety.

SUMMARY

Accordingly, the present invention has been made in view of the above circumstances, and an object of the present invention is to provide an inductive load driving device that noise generated by PWM driving signals when a plurality of inductive loads is simultaneously driven by PWM driving signals is lowered.

In order to achieve the above object, an inductive load driving device according to a first aspect of the present invention comprises two inductive loads connected to a power source, two switching elements, which are connected in series to the two inductive loads, respectively, their on/off are controlled by a pulse width modulation signal respectively, received from an external, and permit conduction of the two inductive loads, respectively, in an on state, and a control device, which outputs the pulse width modulation signal to each of the two switching elements and controls the on/off of each of the two switching elements, wherein the pulse width modulation signal is configured such that a rising edge of one pulse of the pulse width modulation signal to be output to one switching element starts between an end point of a rising edge and a start point of a trailing edge of one pulse of the pulse width modulation signal to be output to the other switching element, and a time from a start point of a trailing edge to an end point of the trailing edge of the one pulse of the pulse modulation signal to be output to one switching element does not overlap with a time from the start point of the trailing edge to an end point of the trailing edge of the one pulse of the pulse width modulation signal to be output to the other switching element According to the above structure, since the two switching elements are switched at different times such that the changing intervals of pulses of the two pulse width modulation signals do not overlap, the increase in the noise generation resulting in the overlapped switching can be controlled.

An inductive load driving device according to a second aspect of the present invention comprises two inductive loads connected to a power source, two switching elements, which are connected in series to the two inductive loads, respectively, their on/off are controlled by a pulse width modulation signal, respectively, received from an external, and permit conduction of the two inductive loads, respectively, in an on state, and a control device, which outputs the pulse width modulation signal to each of the two switching elements and controls the on/off of each of the two switching elements, wherein the pulse width modulation signal is configured such that a rising edge of one pulse of the pulse width modulation signal to be output to one switching element starts at an end point of a rising edge of one pulse of the pulse width modulation signal to be output to the other switching element, and a trailing edge of the one pulse of the pulse width modulation signal to be output to one switching element starts at an end point of a trailing edge of the one pulse of the pulse width modulation signal to be output to the other switching element.

According to the above structure, since the two switching elements are switched at different times such that the changing intervals of pulses of the two pulse width modulation signals do not overlap, the increase in the noise generation resulting in the overlapped switching can be controlled.

In addition, since the pulses of the two pulse width modulation signals are generated such that parts of the changing points of the pulses become the same timing, the harmonic noise generated in the changing points of the pulses can be lowered.

An inductive load driving device according to a third aspect of the present invention comprises two inductive loads connected to a power source, two switching elements, which are connected in series to the two inductive loads, respectively, their on/off are controlled by a pulse modulation signal, respectively, received from an external, and permit conduction of the two inductive loads, respectively, in an on state, and a control device, which outputs the pulse width modulation signal to each of the two switching elements and controls the on/off of each of the two switching elements, wherein the pulse width modulation signal is configured such that a rising edge of one pulse of the pulse width modulation signal to be output to one switching element starts at an end point of a rising edge of one pulse of the pulse width modulation signal to be output to the other switching element, and a trailing edge of the one pulse of the pulse width modulation signal to be output to one switching element ends at a start point of trailing edge of the one pulse of the pulse width modulation signal to be output to the other switching element.

According to the above structure, since the two switching elements are switched at different times such that the changing intervals of pulses of the two pulse width modulation signals do not overlap, the increase in the noise generation resulting in the overlapped switching can be controlled.

In addition, since the pulses of the two pulse width modulation signals are generated such that parts of the changing points of the pulses become the same timing, the harmonic noise generated in the changing points of the pulses can be lowered.

An inductive load driving device according to a fourth aspect of the present invention comprises two inductive loads connected to a power source, two switching elements, which are connected in series to the two inductive loads, respectively, their on/off are controlled by a pulse width modulation signal, respectively, received from an external, and permit conduction of the two inductive loads, respectively, in an on state, and a control device, which outputs the pulse width modulation signal to each of the two switching elements and controls the on/off of each of the two switching elements, wherein the pulse width modulation signal to be output to one switching element and the pulse width modulation signal to be output to the other switching element include a predetermined phase difference and a predetermined difference of duty ratio, and the predetermined phase difference and the predetermined difference of duty ratio have relationship, which satisfies a predetermined equation.

According to one embodiment of the present invention, the equation can be expressed with the phase difference=1.8×(m/n)×the difference of duty ratio, where, m and n are a positive integral number.

According to the above structure, since the two switching elements are switched at different times such that the changing intervals of the pulses of the two pulse width modulation signals do not overlap, the increase in the noise generation resulting in the overlapped switching can be lowered.

Since the phase difference and the duty ratio of the two pulse width modulation signals are set such that the synthetic harmonic of the two pulse width modulation signals becomes the lowest, the noise by the synthetic harmonic can be lowered.

PRIORITY CLAIM

The present application is based on and claims priority from Japanese application No. 2005-123841, filed on Apr. 21, 2005, the disclosure of which is hereby incorporated by reference herein in their entirety.

BRIEF DESCRIPTION OF THE DRAWINGS

FIG. 11 shows an example of simulation results of harmonic noise when driving switching elements in the third embodiment of the present invention.

FIG. 15 shows an example of simulation results of harmonic noise when driving the switching elements in the related art.

FIG. 16 shows an example of simulation results of another harmonic noise when driving the switching elements in the related art.

FIG. 17 shows an example of simulation results of another harmonic noise when driving the switching elements in the related art.

DETAILED DESCRIPTION OF THE PREFERRED EMBODIMENTS

Hereinafter, embodiments of the present invention will be explained with reference to the accompanying drawings.

First Embodiment

Figure 1:
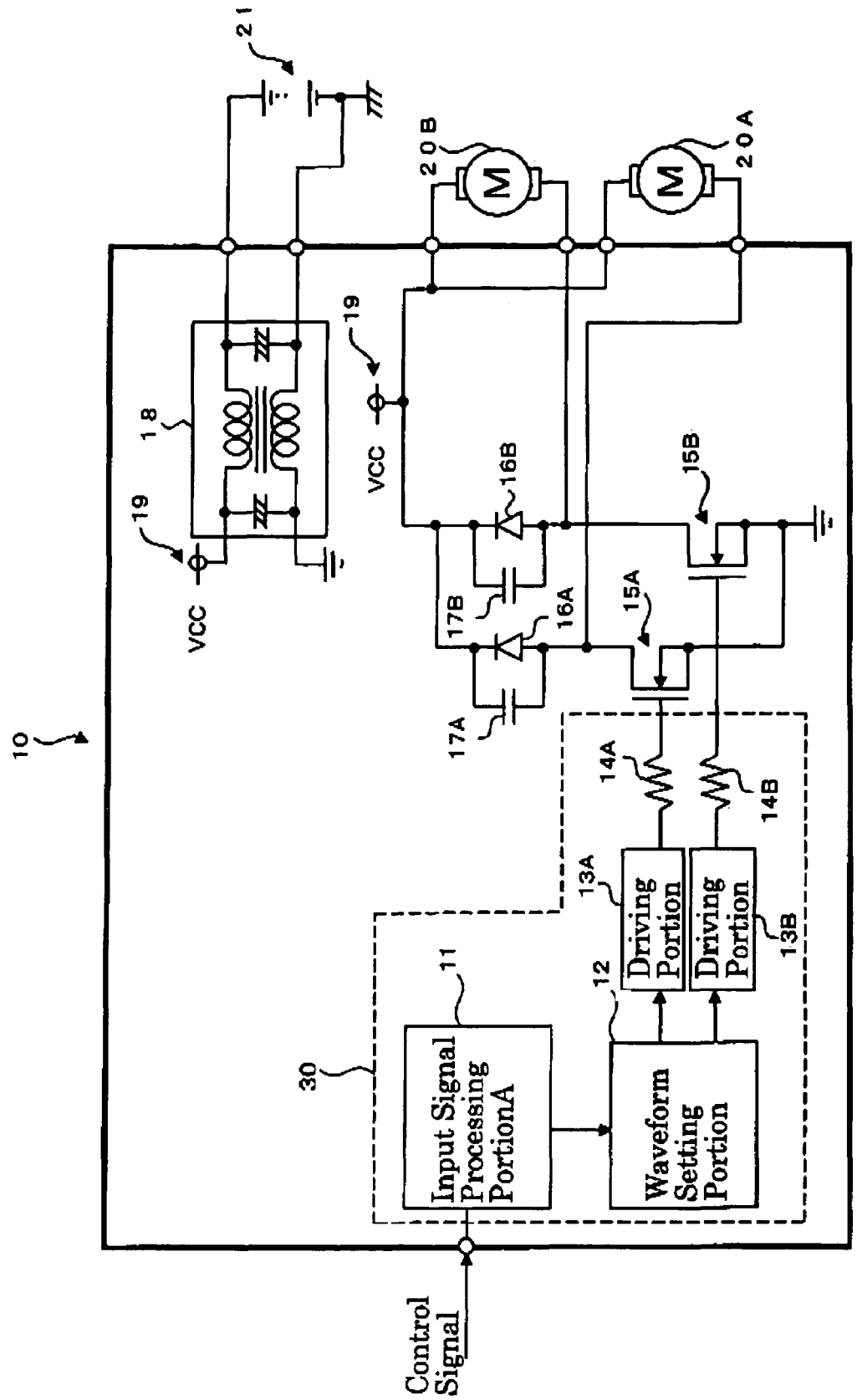
FIG. 1 is a block diagram of a first embodiment of the present invention.

FIG. 1 is a block diagram of the first embodiment of the present invention.

The voltage of a power source 21 is converted into a predetermined voltage VCC19 by a transformer 18.

A motor 20A and a series circuit of a MOSFET 15A, and a motor 20B and a series circuit of a MOSFET 15B are connected in parallel between the VCC 19 and the ground. The drains of MOSFET 15A, 15B are connected to the VCC 19 through diodes 16A, 16B in the forward direction, respectively.

The diodes 16A, 16B are connected with condensers 17A, 17B for noise elimination in parallel, respectively.

An input signal processing portion 11 receives the control signals of the motors 20A, 20B from another device (not shown), and outputs PWM signals to a waveform setting portion 12.

The waveform setting portion 12 generates a PWM driving signal A and a PWM driving signal B of two types of PWM driving signals having relationship of a previously set duty ratio and phase difference based on the PWM signals loaded from the input signal processing portion 11, and then outputs the PWM driving signals A, B to the driving portions 13A, 13B.

After the PWM driving signals A, B generated by the waveform setting portion 12 are amplified by driving portions 13A, 13B, respectively, the pulse shapes are formed by resistances 14A, 14B, respectively. Thereafter the PWM driving signals A, B having the formed pulse shape are output to the gates of the MOSFET 15A, 15B.

In this case, the above motors 20A, 20B are inductive loads in the following claims. The above MOSFET 15A, 15B are switching elements in the following claims. A control device 30 including the above input signal processing portion 11, waveform setting portion 12, driving portions 13A, 13B and resistances 14A, 14B is a control device in the following claims.

Next, the operation of the first embodiment according to the present invention will be explained.

In the present embodiment, parts of the changing points of the pulses of two PWM driving signals are aligned by shifting the phases of two PWM driving signals so as to reduce the number of changing points of the pulses in its entirety. Accordingly, the harmonic noise generated in the changing points of the pulses is lowered.

Figure 2:
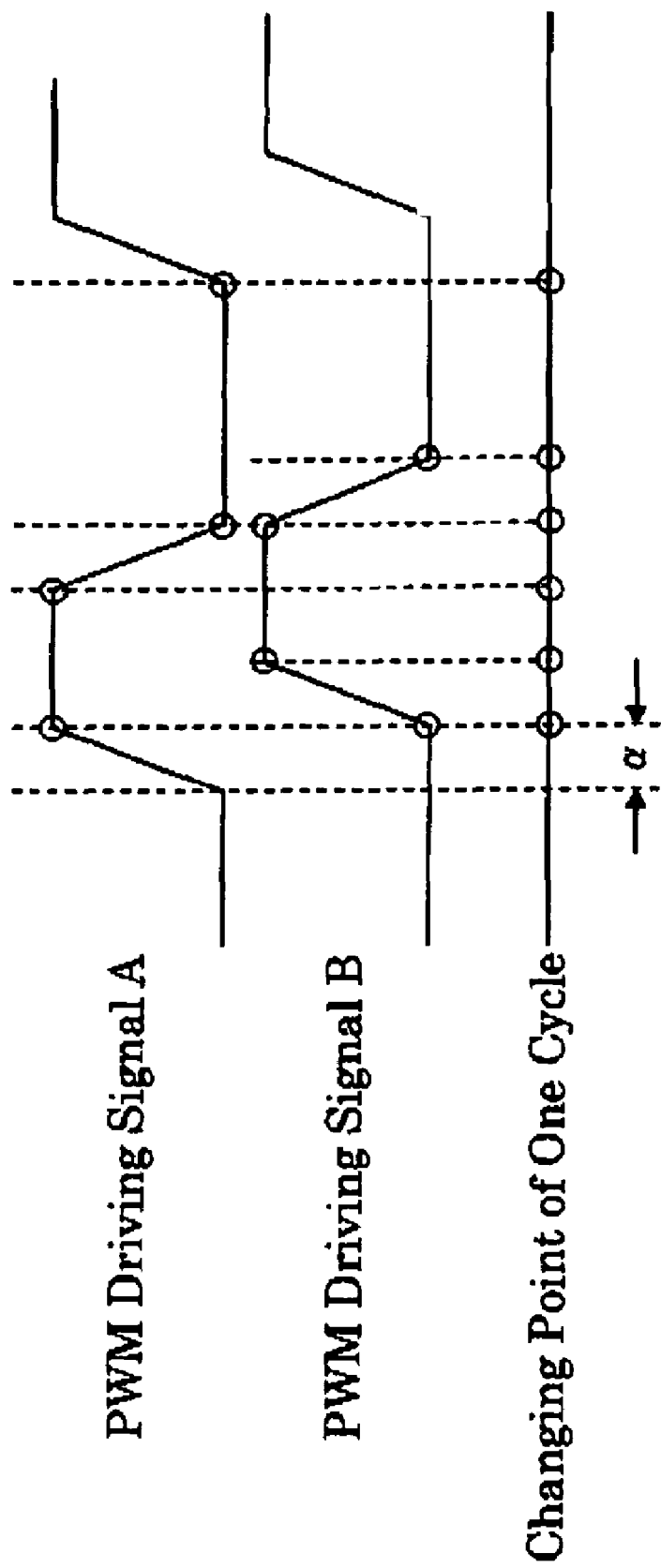
FIG. 2 is a timing chart of the PWM driving signals of the first embodiment of the present invention.

In the present embodiment, the PWM driving signal A and the PWM driving signal B to be output by the control device 30 are generated with the relationship shown in FIG. 2.

More particularly, the rising edge of the PWM driving signal B starts at the end point of the rising edge of the PWM driving signal A, and also the trailing edge of the PWM driving signal B starts at the end point of the trailing edge of the PWM driving signal A. If parts of the changing points of the pulses of the PWM driving signal A and the PWM driving signal B are aligned as described above, the number of changing points is reduced in its entirety; thus, the harmonic noise generated at the changing points of the pulses is lowered.

This relationship can be achieved if the PWM driving signal B is out of phase by a predetermined amount ($\alpha$ in FIG. 2), and is not dependent on the value of duty ratio.

FIGS. 15-17 show examples of simulation results of harmonic noise by PWM driving signal A and PWM driving signal B generated with the contents of JP-A-H10-2222. In addition, FIGS. 3-5 show examples of simulation results of the harmonic noise by the PWM driving signal A and the PWM driving signal B generated with the contents of the present embodiment.

Figure 3:
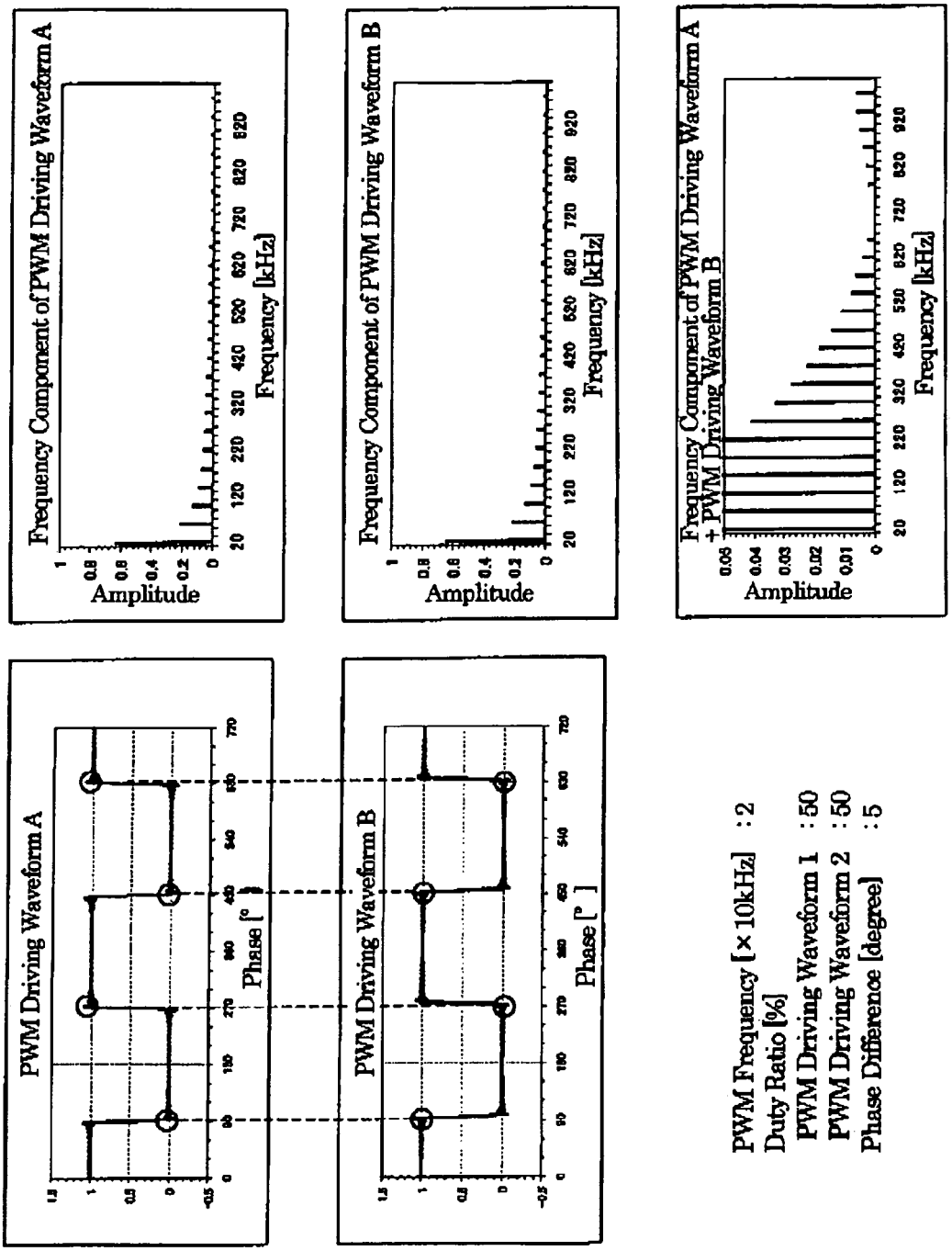
FIG. 3 shows an example of simulation results of harmonic noise when driving the switching elements in the first embodiment of the present invention.

FIGS. 3 and 15 show the results when the duty ratio is 50%. FIGS. 4 and 16 show the results when the duty ratio is 70%. FIGS. 5 and 17 show the results when the duty ratio is 90%.

As apparent from the comparison between FIGS. 3 and 15, compared to the method in JP-A-H10-2222, it can be confirmed that the frequency distribution of noise in the present invention is lowered between about 500 kHz-1000 kHz of the AM radio band.

Figure 4:
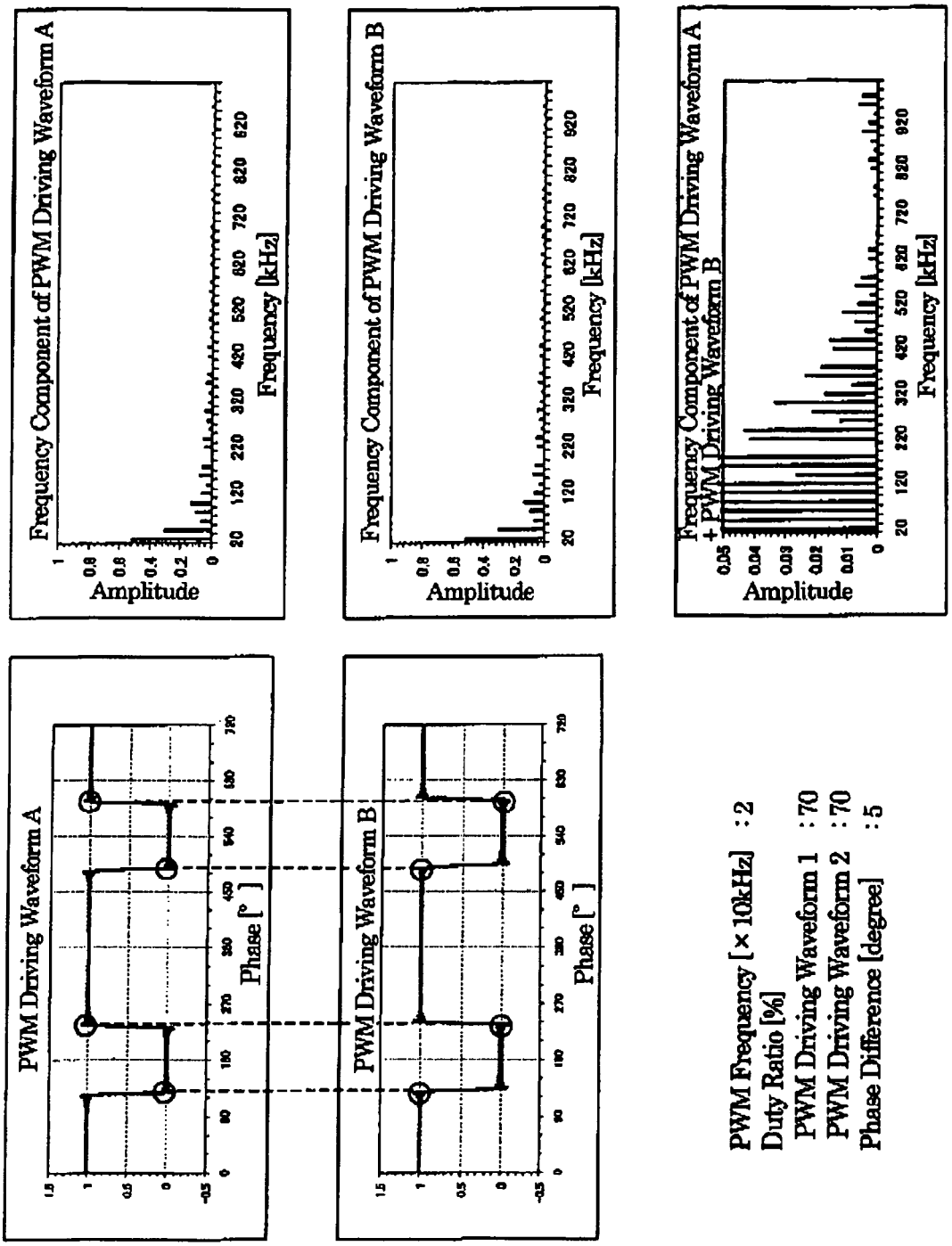
FIG. 4 shows an example of simulation results of another harmonic noise when driving the switching elements in the first embodiment of the present invention.
Figure 5:
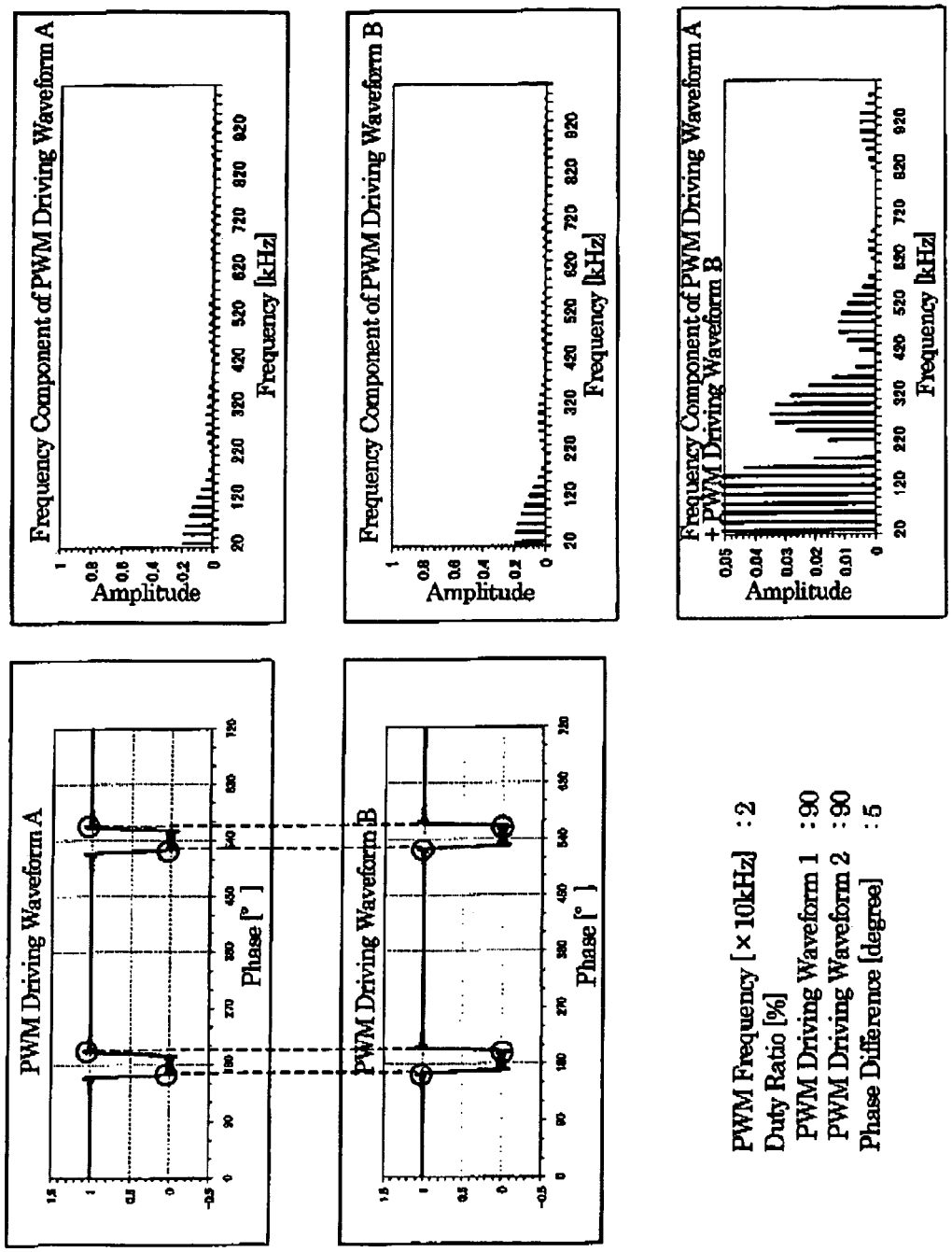
FIG. 5 shows an example of simulation results of another harmonic noise when driving the switching elements in the first embodiment of the present invention.

Moreover, as apparent from the comparison between FIGS. 4 and 16, compared to the method in JP-A-H10-2222, it can be confirmed that the frequency distribution of noise in the present embodiment is lowered between about 500 kHz-1000 kHz of the AM radio band.

Figure 6:
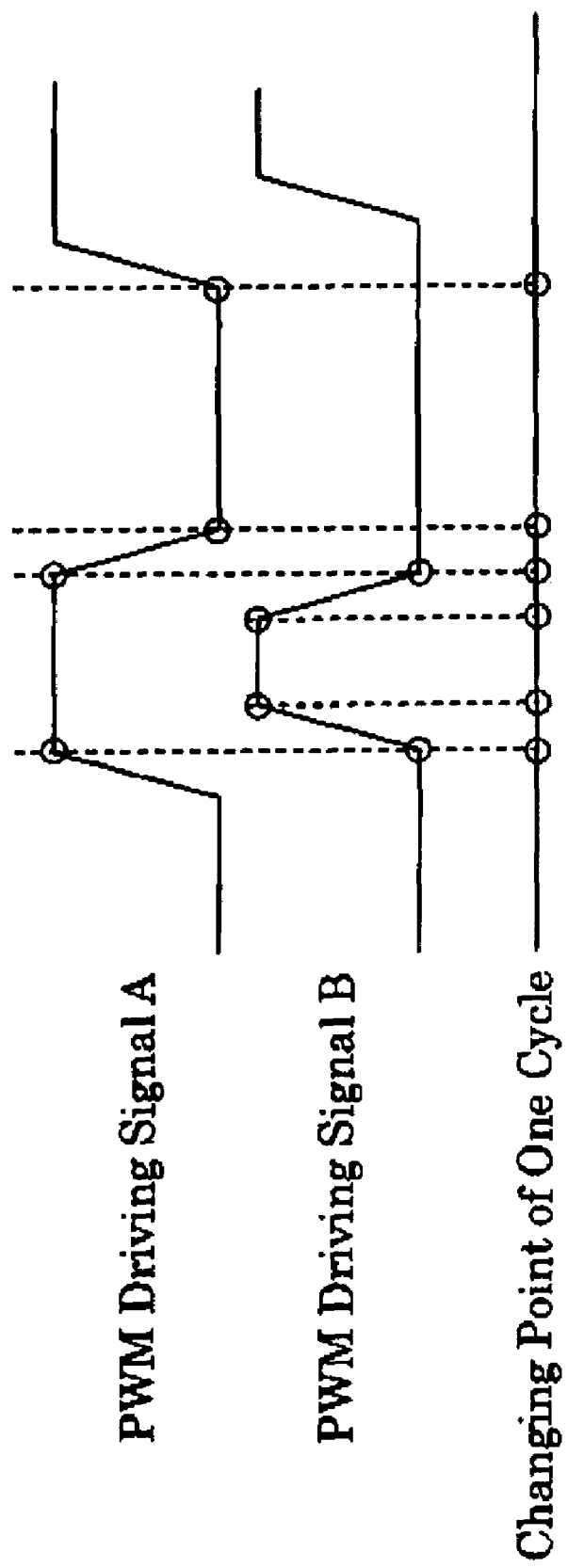
FIG. 6 is a timing chart of the PWM driving signals in the second embodiment of the present invention.

Furthermore, as apparent from the comparison between FIGS. 6 and 17, compared to the method in JP-A-H10-2222, it can be confirmed that the frequency distribution of noise in the present embodiment is lowered between about 500 kHz-1000 kHz of the AM radio band.

As the above described operation, since the two switching elements are switched at different times such that the changing intervals of pulses of the two pulse width modulation signals do not overlap, the increase in the noise generation resulting in the overlapped switching can be controlled.

In addition, since the number of changing points of the pulses is reduced in its entirety, the harmonic noise, especially, the harmonic noise having a frequency about 500 kHz-1000 kHz of the AM radio band can be lowered compared to the related art.

Second Embodiment

Next, the operation of the second embodiment according to the present invention will be explained.

In the present embodiment, the duty ratio of two PWM driving signals are changed, and parts of the changing points of pulses of the two PWM driving signals are aligned so as to reduce the number of the changing points of pulses in its entirety. Therefore, the harmonic noise generated at the changing points of the pulses is lowered.

In the present embodiment, the PWM driving signal A and the PWM driving signal B to be output by the control device 30 are generated with the relationship shown in FIG. 6.

More particularly, the rising edge of the PWM driving signal B starts at the end point of the rising edge of the PWM driving signal A, and also the trailing edge of the PWM driving signal B ends at the start point of the trailing edge of the PWM driving signal A. If parts of the changing points of the pulses of the PWM driving signal A and the PWM driving signal B are aligned as described above, the number of changing points of the pulse are reduced in its entirety; thereby, the harmonic noise generated at the changing points of the pulses are lowered.

This relationship can be achieved by changing the duty ratio of the PWM driving signal B, and the phase difference is not required between the PWM driving signal A and the PWM driving signal B.

FIG. 15-17 show examples of simulation results of harmonic noise by the PWM driving signal A and the PWM driving signal B generated with the contents in JP-A-H-10-2222. In addition, FIGS. 7-9 show examples of simulation results of harmonic noise by the PWM driving signal A and the PWM driving signal B generated with the contents of the present embodiment.

Figure 7:
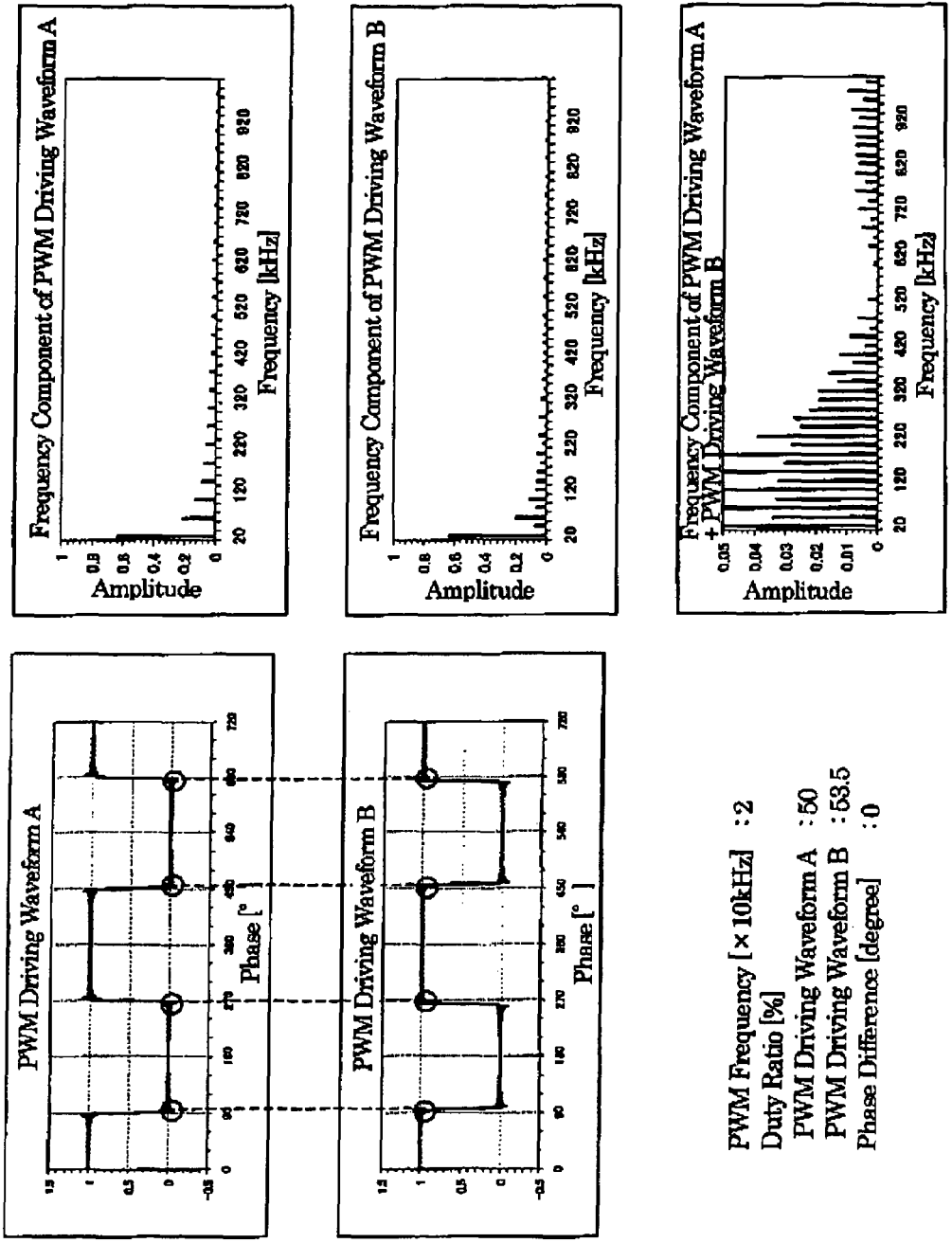
FIG. 7 shows an example of simulation results of harmonic noise when driving the switching elements in the second embodiment of the present invention.

FIG. 7 shows the results when the duty ratio of the PWM driving signal A is 50% and the duty ratio of the PWM driving signal B is 53.5%. FIG. 8 shows the results when the duty ratio of the PWM driving signal A is 70% and when the duty ratio of the PWM driving signal B is 73.5%, FIG. 9 shows the results when the duty ratio of the PWM driving signal A is 90% and the duty ratio of the PWM driving signal B is 93.5%.

As apparent from the comparison between FIG. 7 and FIG. 15, compared to the method in JP-A-H10-2222, it can be confirmed that the frequency distribution of noise in the present embodiment is lowered between about 500 kHz-1000 kHz of the AM radio band.

Figure 8:
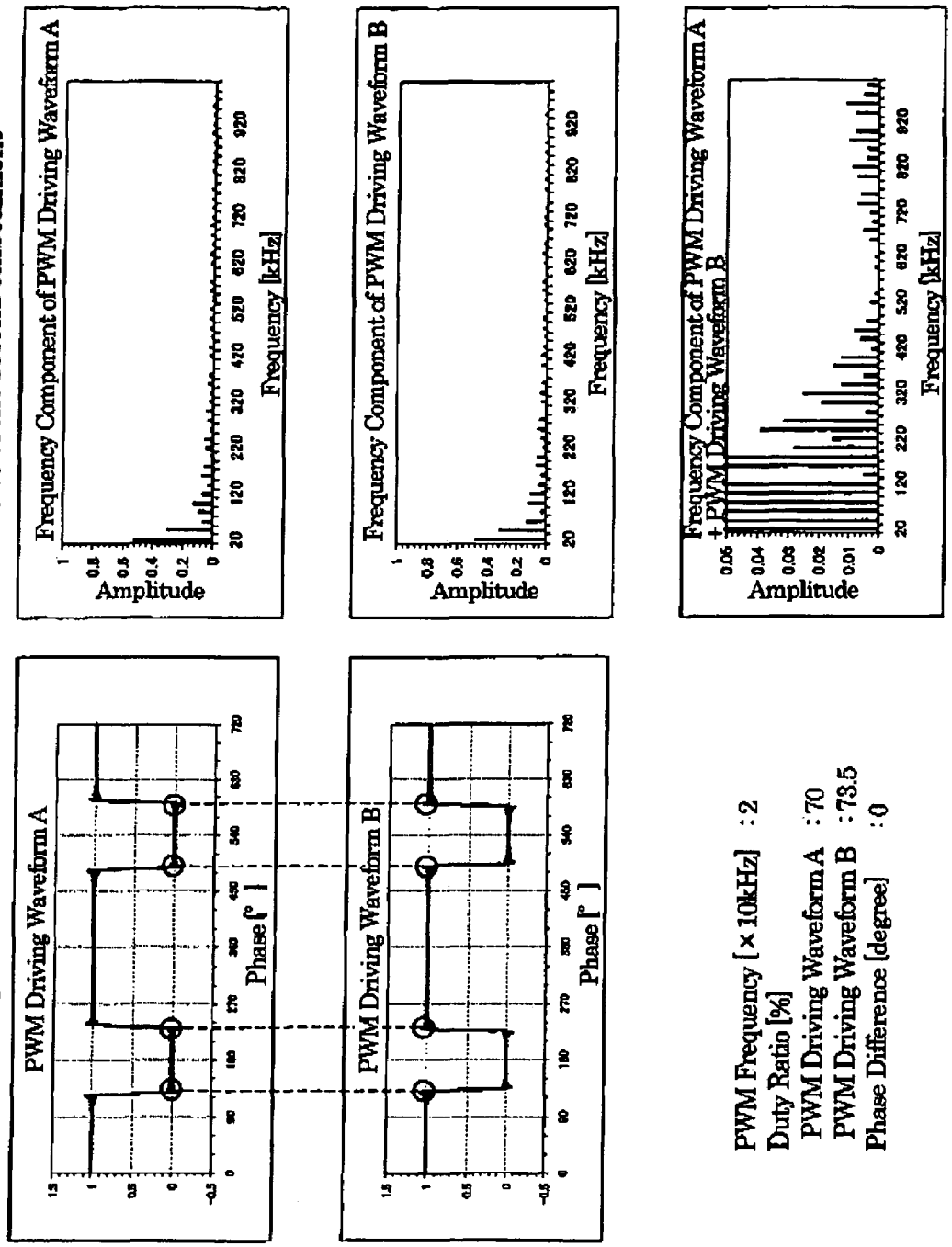
FIG. 8 shows an example of simulation results of another harmonic noise when driving the switching elements in the second embodiment of the present invention.
Figure 9:
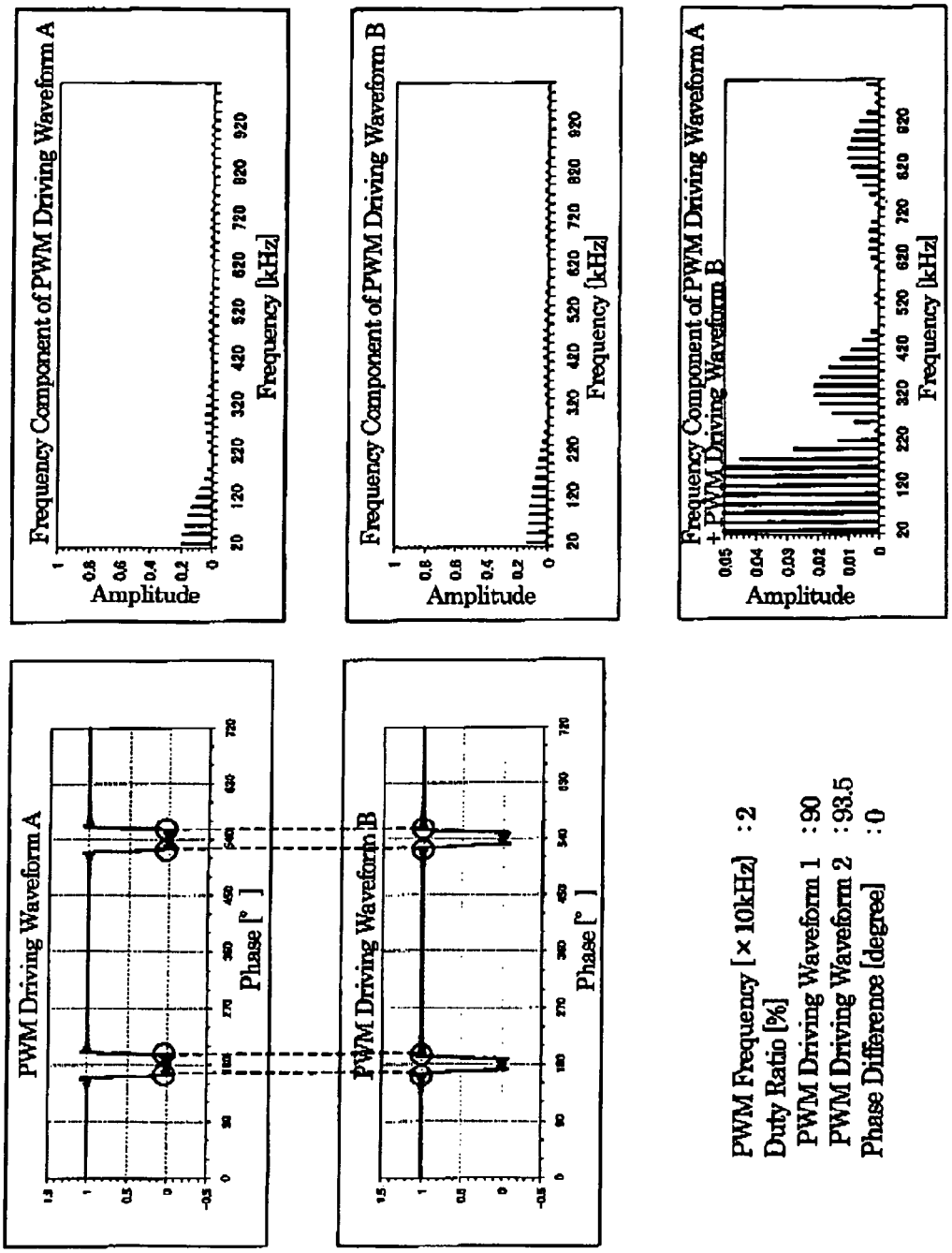
FIG. 9 shows an example of simulation results of another harmonic noise when driving the switching elements in the second embodiment of the present invention.

As apparent from the comparison between FIG. 8 and FIG. 16, compared to the method in JP-A-H10-2222, it can be confirmed that the frequency distribution of noise in the present embodiment is lowered between about 500 kHz-1000 kHz of the AM radio band.

As apparent from the comparison between FIG. 9 and FIG. 17, compared to the method in JP-A-H10-2222, it can be confirmed that the frequency distribution of noise in the present embodiment is lowered between about 500 kHz-1000 kHz of the AM radio band.

As the above described operation, since the two switching elements are switched at different times such that the changing intervals of the pulses of two pulse width modulation signals do not overlap, the increase in the noise generation resulting in the overlapped switching can be controlled.

In addition, since the number of changing points of the pulse is reduced in its entirety, the harmonic noise, especially, the harmonic noise having a frequency about 500 kHz-1000 kHz of the AM radio band can be lowered compared to the related art.

Third Embodiment

Next the operation of the third embodiment according to the present invention will be explained.

In the present embodiment, the harmonic noise is lowered by changing the phases and the duty ratio of the two PWM driving signals.

Where the frequency of two PWM driving signals is f and the phase difference of two PWM driving signals is Φ, the frequency F0 (Φ) that the synthetic harmonic synthesized the harmonic of each of the two PWM driving signals becomes 0 can be expressed with the following equation.

$$F0(\Phi)=n\times(180°\times f)/\Phi \text{(n is an integral number of one or more and also odd number)} \quad \text{(Equation 1)}$$

In addition, the frequency FP (Φ) that the synthetic harmonic increases can be expressed with the following equation.

$$FP(\Phi)=m\times(180°\times f)/\Phi \text{(m is an integral number of two or more and also even number)} \quad \text{(Equation 2)}$$

On the other hand, where the frequency of two PWM driving signals is f and the difference of duty ratio of the two PWM driving signals is D, the frequency F0 (D) that the synthetic harmonic synthesized with the harmonic of each of the two PWM driving signals becomes 0 can be expressed with the following equation.

$$F0(D)=n\times(100\%\times f)/D \text{(n is an integral number of one or more and also odd number)} \quad \text{(Equation 3)}$$

In addition, the frequency FP that the synthetic harmonic increases can be expressed with the following equation.

$$FP(D)=m\times(100\%\times f)/D \text{(m is an integral number of two or more and also even number)} \quad \text{(Equation 4)}$$

In cases where the harmonic noise is lowered by adjusting the phase and the duty ratio, the synthetic harmonic component can be effectively canceled if the condition (Equation 1)=(Equation 4) or (Equation 2)=(Equation 3) can be met.

By the relationship (Equation 2)=(Equation 3), the following equation is led.

$$\Phi=1.8\times(m/n)\times D \quad \text{(Equation 5)}$$

Figure 10:
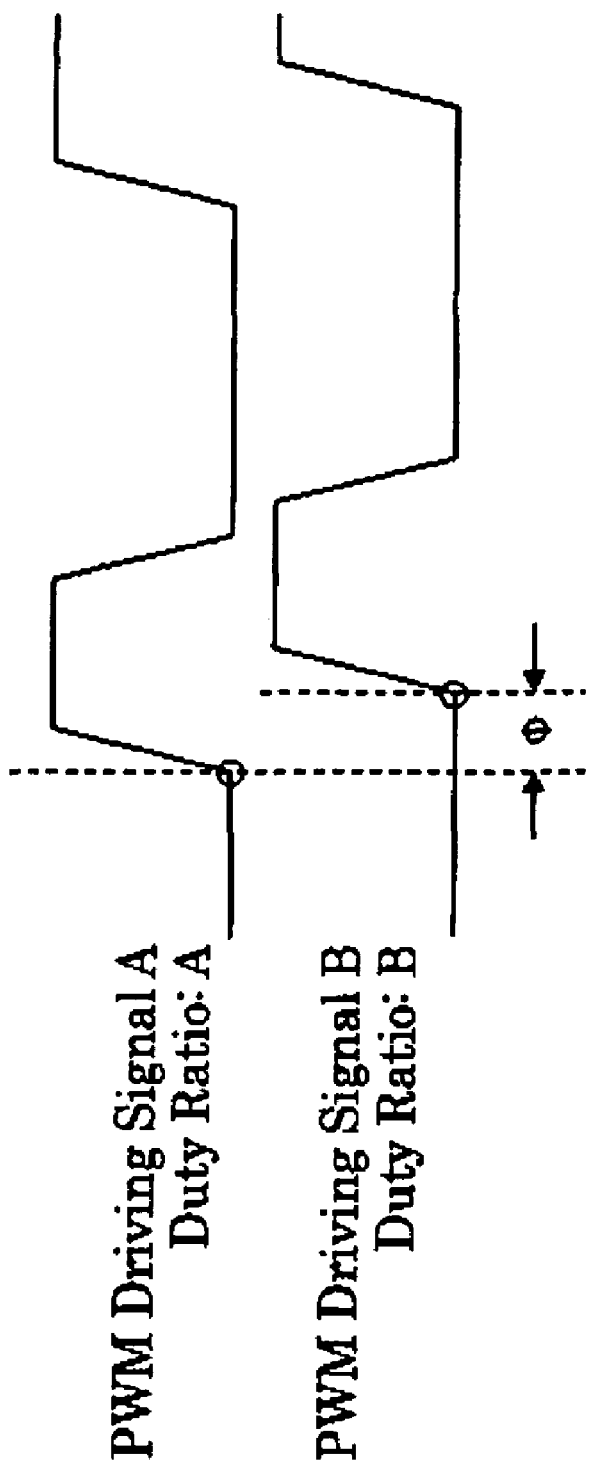
FIG. 10 is a timing chart of the PWM driving signals in the third embodiment of the present invention.

FIG. 10 shows the PWM driving signal A and the PWM driving signal B having the above relationship.

Figure 12:
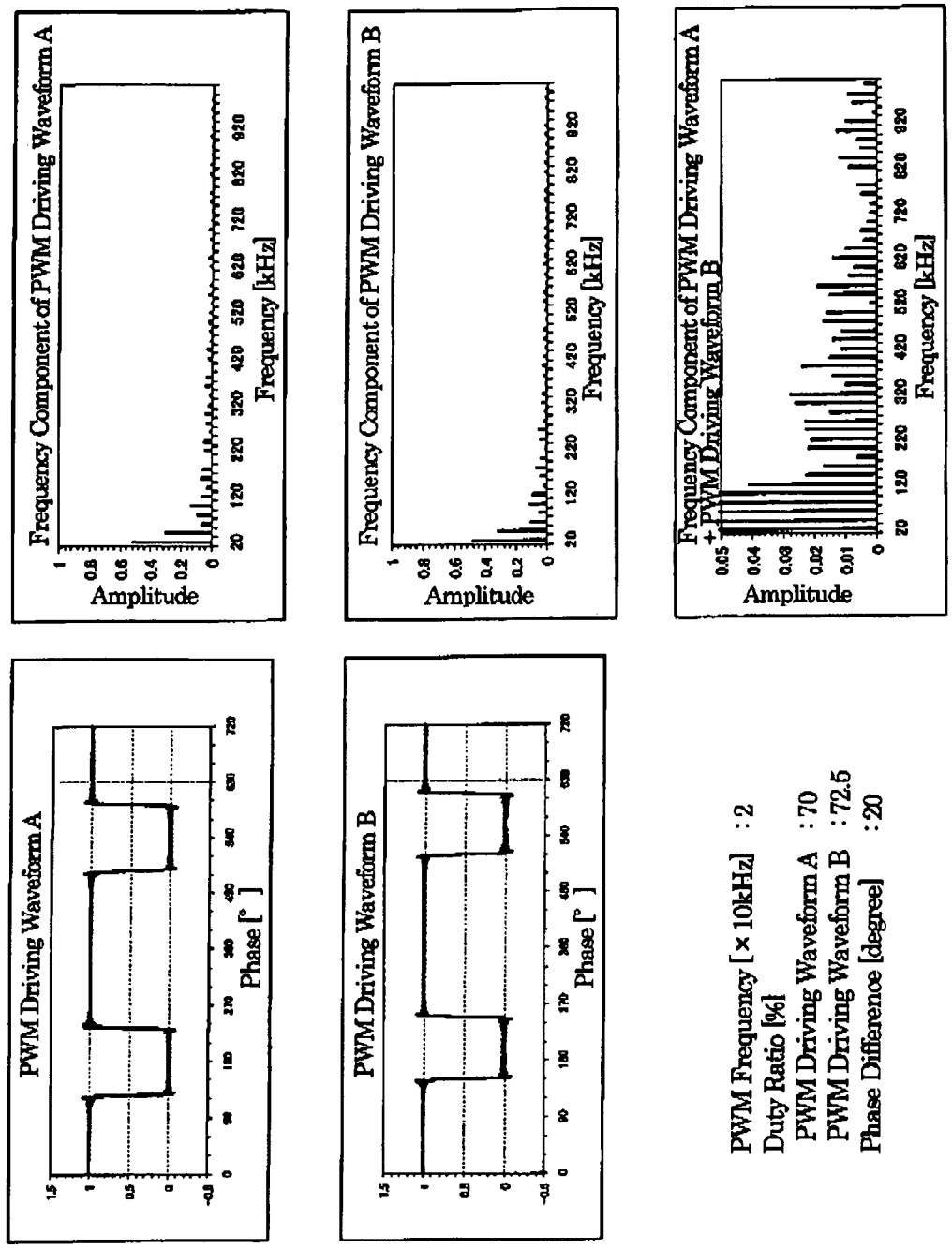
FIG. 12 shows an example of simulation results of another harmonic noise when driving the switching elements in the third embodiment of the present invention.
Figure 13:
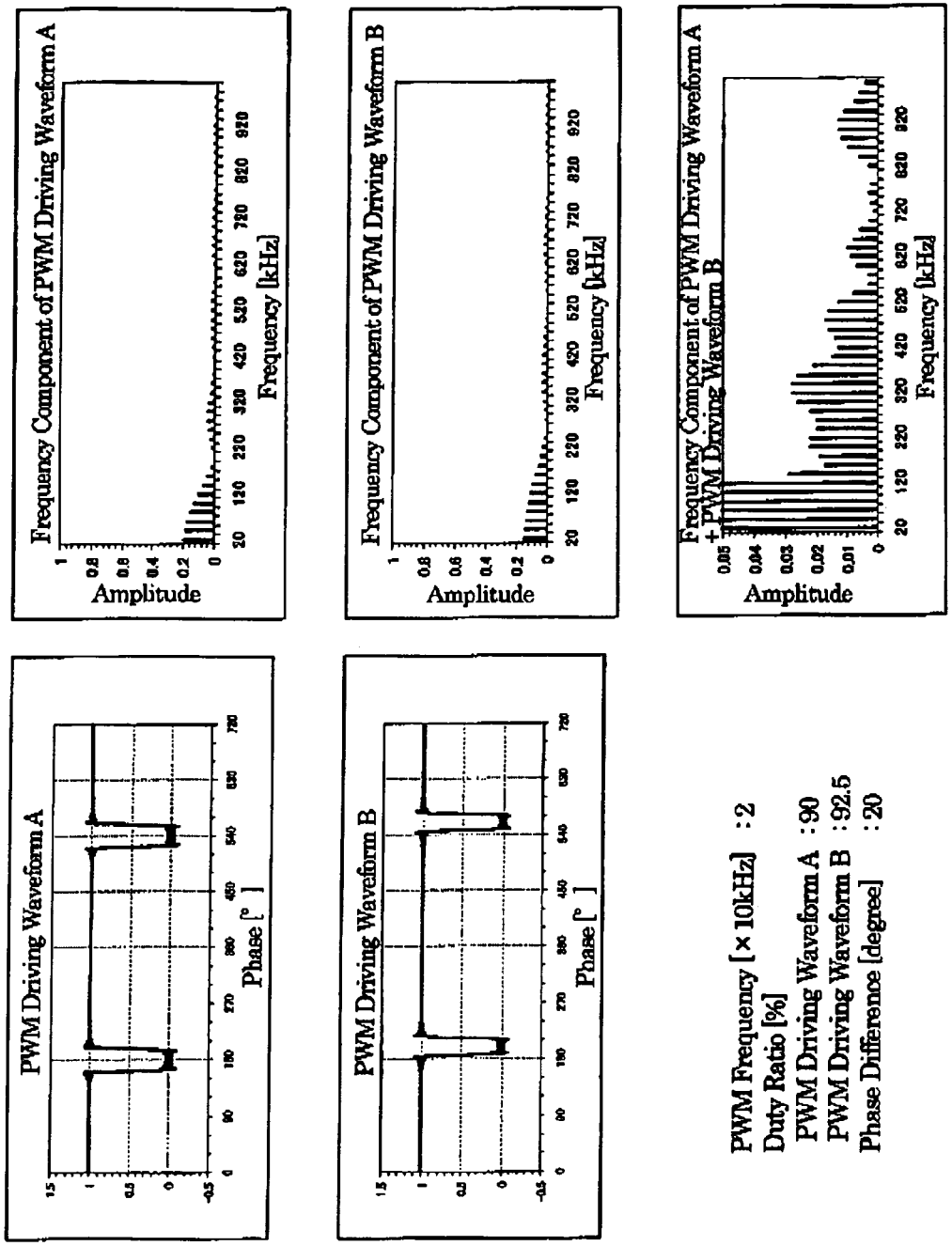
FIG. 13 shows an example of simulation results of another harmonic noise when driving the switching elements in the third embodiment of the present invention.
Figure 14:
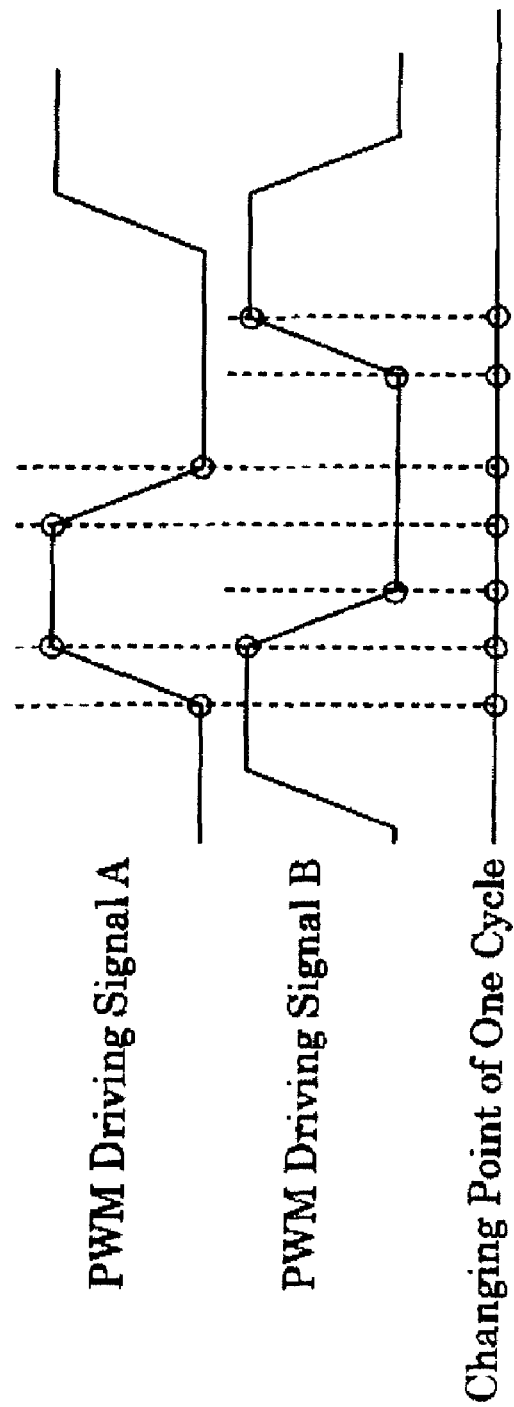
FIG. 14 is a timing chart of the PWM driving signals in the related art.

FIGS. 15-17 show examples of simulation results of harmonic noise by the PWM driving signal A and the PWM driving signal B generated with the contents described in JP-A-H10-2222. Moreover, FIGS. 11-13 show examples of simulation results of harmonic noise by the PWM driving signal A and the PWM driving signal B generated with the contents of the present embodiment.

In Equation 5, it is set that D=2.5, m/n=4 and Φ≈20

FIG. 11 shows the results when the duty ratio of the PWM driving signal A is 50%, the duty ratio of the PWM driving signal B is 52.5%, and the phase difference is 20 degrees. FIG. 12 shows the results when the duty ratio of the PWM driving signal A is 70%, the duty ratio of the PWM driving signal B is 72.5%, and the phase difference is 20 degrees. FIG. 13 shows the results when the duty ratio of the PWM driving signal A is 90%, the duty ratio of the PWM driving signal B is 92.5%, and the phase difference is 20 degrees.

As apparent from the comparison between FIG. 11 and FIG. 15, compared to the method in JP-A-H10-2222, it can be confirmed that the frequency distribution of noise in the present embodiment is lowered between about 500 kHz-1000 kHz of the AM ratio band.

Moreover, as apparent from the comparison between FIG. 12 and FIG. 16, compared to the method in JP-A-H10-2222, it can be confirmed that the frequency distribution of nose in the present embodiment is lowered between about 500 kHz-1000 kHz of the AM ratio band.

Furthermore, as apparent from the comparison between FIG. 13 and FIG. 17, compared to the method in JP-A-H10-2222, it can be confirmed that the frequency distribution of noise in the present embodiment is lowered between about 500 kHz-1000 kHz of the AM radio band.

As the above described operation, since the two switching elements are switched at different times such that the changing intervals of pulses of the two pulse width modulation signals do not overlap, the increase in the noise generation resulting in the overlapped switching can be controlled.

In addition, since the phase difference Φ and the difference D of duty ratio are set such that the synthetic harmonic becomes the lowest, the harmonic noise, especially, the harmonic noise having a frequency of 500 kHz-1000 kHz of the AM radio band can be lowered compared to the related art.

It should be noted that although the present invention has been described with respect to specific embodiments, the invention is not limited to these specific embodiments. In view of the foregoing, it is intended that the present invention cover modifications and variations provided they fall within the scope of the following claims and their equivalents.

For example, in the third embodiment, the phase difference and the difference of duty ratio of the PWM driving signal A and the PWM driving signal B are not limited to the values shown in the third embodiment, can be the values which meet the relationship of (Equation 5).

According to the present invention, the inductive load driving device, which lowers the noise generated by PWM driving signals when a plurality of indicative loads is simultaneously driven by PWM driving signals, can be achieved.

What is claimed is:

1. An inductive load driving device, comprising:
   a first motor and a second motor connected to a power source;
   a first switching element, which is connected in series to the first motor, and permits conduction of the first motor in an on state;
   a second switching element, which is connected in series to the second motor, and permits conduction of the second motor in an on state; and
   a control device, which outputs a first pulse width modulation signal to the first switching element, outputs a second pulse width modulation signal to the second switching element and controls on/off of the first switching element and the second switching element, wherein
   a rising edge of one pulse of the second pulse width modulation signal to be output to the second switching element starts between an end point of a rising edge and a start point of a trailing edge of one pulse of the first pulse width modulation signal to be output to the first switching element, and a time from the start point of the trailing edge to an end point of the trailing edge of the one pulse of the first pulse width modulation signal to be output to the first switching element does not overlap with a time from a start point of a trailing edge to an end point of the trailing edge of the one pulse of the second pulse width modulation signal to be output to the second switching element.

2. An inductive load driving device, comprising:

a first motor and a second motor connected to a power source;

a first switching element, which is connected in series to the first motor, and permits conduction of the first motor in an on state;

a second switching element, which is connected in series to the second motor, and permits conduction of the second motor in an on state; and a control device, which outputs a first pulse width modulation signal to the first switching element, outputs a second pulse width modulation signal to the second switching element and controls on/off of the first switching element and the second switching element, wherein a rising edge of one pulse of the second pulse width modulation signal to be output to the second switching element starts at an end point of a rising edge of one pulse of the first pulse width modulation signal to be output to the first switching element, and a trailing edge of the one pulse of the second pulse width modulation signal to be output to the second switching element starts at an end point of a trailing edge of the one pulse of the first pulse width modulation signal to be output to the first switching element.

3. An inductive load driving device, comprising:

a first motor and a second motor connected to a power source;

a first switching element, which is connected in series to the first motor, and permits conduction of the first motor in an on state;

a second switching element, which is connected in series to the second motor, and permits conduction of the second motor in an on state; and a control device, which outputs a first pulse width modulation signal to the first switching element, outputs a second pulse width modulation signal to the second switching element and controls on/off of the first switching element and the second switching element, wherein a rising edge of one pulse of the second pulse width modulation signal to be output to the second switching element starts at an end point of a rising edge of one pulse of the first pulse width modulation signal to be output to the first switching element, and a trailing edge of the one pulse of the second pulse width modulation signal to be output to the second switching element ends at a start point of a trailing edge of the one pulse of the first pulse width modulation signal to be output to the first switching element.

4. An inductive load driving device, comprising:

a first motor and a second motor connected to a power source;

a first switching element, which is connected in series to the first motor, and permits conduction of the first motor in an on state, a second switching element, which is connected in series to the second motor, and permits conduction of the second motor in an on state; and a control device, which outputs a first pulse width modulation signal to the first switching element, outputs a second pulse width modulation signal to the second switching element and controls on/off of the first switching element and the second switching element, wherein a phase and a duty ratio of the first pulse width modulation signal to be output to the first switching element are different from a phase and a duty ratio of the second pulse width modulation signal to be output to the second switching element, and a difference of the phases and a difference of the duty ratios between the first pulse width modulation signal and the second pulse width modulation signal have relationship, which satisfies an equation expressed with the phase difference=1.8×(mm)×the difference of duty ratio, where m and n are a positive integral number.

* * * * *